United States Patent
Li

(10) Patent No.: US 10,708,038 B2
(45) Date of Patent: Jul. 7, 2020

(54) TIMING LOCK IDENTIFICATION METHOD FOR TIMING RECOVERY AND SIGNAL RECEIVING CIRCUIT

(71) Applicant: ALi Corporation, Hsinchu (TW)

(72) Inventor: Rong-yun Li, Shanghai (CN)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 16/430,242

(22) Filed: Jun. 3, 2019

(65) Prior Publication Data

US 2019/0386813 A1     Dec. 19, 2019

(30) Foreign Application Priority Data

Jun. 14, 2018   (CN) .......................... 2018 1 0614263

(51) Int. Cl.
H04L 7/04     (2006.01)
H04L 7/00     (2006.01)

(52) U.S. Cl.
CPC ............ H04L 7/042 (2013.01); H04L 7/0087 (2013.01); H04L 7/048 (2013.01)

(58) Field of Classification Search
CPC ........ H04L 7/042; H04L 7/0087; H04L 7/048
USPC ........................................................ 375/362
See application file for complete search history.

(56) References Cited

U.S. PATENT DOCUMENTS

| | | | | |
|---|---|---|---|---|
| 7,369,000 B2 * | 5/2008 | Wu | .......................... | H03L 7/087 331/1 A |
| 2012/0039378 A1 * | 2/2012 | Nakayama | ............ | H02M 3/337 375/226 |
| 2012/0257699 A1 * | 10/2012 | Choi | ...................... | H04L 7/0008 375/359 |
| 2015/0222280 A1 * | 8/2015 | Allan | ....................... | H03L 7/083 327/157 |
| 2016/0352504 A1 * | 12/2016 | Gu | ......................... | H04L 7/0087 |
| 2017/0026165 A1 * | 1/2017 | Lyu | .................... | H04W 56/0035 |
| 2017/0187384 A1 * | 6/2017 | Shimada | ................. | G01S 19/37 |
| 2018/0048319 A1 * | 2/2018 | Chae | .......................... | H03L 7/07 |
| 2019/0229607 A1 * | 7/2019 | Kim | ....................... | H02M 1/088 |

* cited by examiner

*Primary Examiner* — Hirdepal Singh
(74) *Attorney, Agent, or Firm* — J.C. Patents

(57) ABSTRACT

A timing lock identification method is provided according to an embodiment of the disclosure. The method includes: generating one or more first phase adjustment pulses and one or more second phase adjustment pulses by a timing recovery circuit, where the one or more first phase adjustment pulses are configured to increase a phase of an output signal of an oscillator, and the one or more second phase adjustment pulses are configured to decrease the phase of the output signal; and obtaining a difference value between the number of the one or more first phase adjustment pulses and the number of the one or more second phase adjustment pulses in a detection window and determining whether the timing recovery circuit reaches a locking state of timing recovery according to the difference value. Furthermore, a signal receiving circuit is provided according to an embodiment of the disclosure.

14 Claims, 6 Drawing Sheets

```
                ┌─────────────────────────────────────────────┐
                │  a timing recovery circuit generating one   │
                │  or more first phase adjustment pulses and  │
                │  one or more second phase adjustment        │
                │  pulses, wherein the one or more first      │──S201
                │  phase adjustment pulses are configured to  │
                │  increase a phase of an output signal of    │
                │  an oscillator, and the one or more second  │
                │  phase adjustment pulses are configured to  │
                │  decrease the phase of the output signal    │
                └─────────────────────────────────────────────┘
                                       │
                                       ▼
                ┌─────────────────────────────────────────────┐
                │  obtaining a difference value between the   │
                │  number of the one or more first phase      │
                │  adjustment pulses and the number of the    │
                │  second phase adjustment pulses and         │──S202
                │  determining whether the timing recovery    │
                │  circuit reaches a locking state of timing  │
                │  recovery or not according to the           │
                │  difference value                           │
                └─────────────────────────────────────────────┘
```

FIG. 2

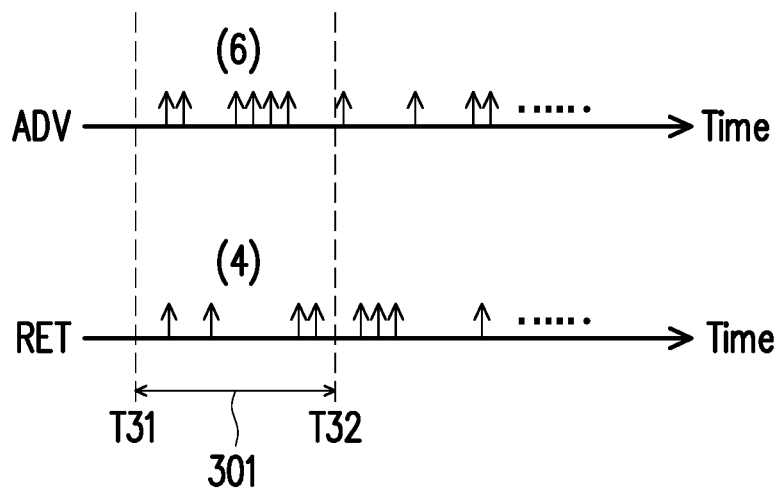

FIG. 3

TIMING LOCK IDENTIFICATION METHOD FOR TIMING RECOVERY AND SIGNAL RECEIVING CIRCUIT

CROSS-REFERENCE TO RELATED APPLICATION

This application claims the priority benefit of China application serial no. 201810614263.X, filed on Jun. 14, 2018. The entirety of the above-mentioned patent application is hereby incorporated by reference herein and made a part of this specification.

BACKGROUND OF THE INVENTION

Field of the Invention

The disclosure relates to a timing recovery technology of a signal, and more particularly to a timing lock identification method for timing recovery and a signal receiving circuit.

Description of Related Art

After a transmitting end transmits a signal, the signal may decay and be disturbed by the noise when passing through the channel. Therefore, in the signal receiving device at the receiving end, it is usually necessary to set a timing recovery circuit to perform timing recovery operations such as channel compensation, noise filtering and timing error elimination on the received signal. Generally, after the timing recovery operation of the timing recovery circuit is started, the determination may be made with the mean square error (MSE) or the phase error discrimination characteristic curve (also referred to as the S-curve). However, the mean square error may be affected by the setting of the threshold, causing errors in the determination result. In addition, the S-curve has a non-linear interval, causing false-lock in the determination result. In other words, neither of the two methods described above may guarantee the robustness of the determination.

SUMMARY OF THE INVENTION

In this concern, a timing lock identification method for timing recovery and a signal receiving circuit that enhance the identification efficiency of the timing lock identification are provided.

In an embodiment of the disclosure, a timing lock identification method for timing recovery including the following is provided. One or more first phase adjustment pulses and one or more second phase adjustment pulses are generated by a timing recovery circuit, wherein the one or more first phase adjustment pulses are configured to increase a phase of an output signal of an oscillator, and the one or more second phase adjustment pulses are configured to decrease the phase of the output signal. A difference value between the number of the one or more first phase adjustment pulse and the number of the one or more second phase adjustment pulses in a detection window is obtained, and whether the timing recovery circuit reaches a locking state of timing recovery or not is determined according to the difference value.

In an embodiment of the disclosure, a signal receiving circuit including a receiving circuit, a timing recovery circuit and an oscillator is also provided. The receiving circuit receives an input signal and generates an output signal. The timing recovery circuit is connected to the receiving circuit and generates one or more first phase adjustment pulses and one or more second phase adjustment pulses. The oscillator is connected to the receiving circuit and the timing recovery circuit, and increases a phase of the output signal according to the one or more first phase adjustment pulses or decreases the phase of the output signal according to the one or more second phase adjustment pulses. In addition, the timing recovery circuit determines whether a locking state of timing recovery is reached or not based on a difference value between the number of the one or more first phase adjustment pulses in a detection window and the number of the second phase adjustment pulses in the detection window.

Based on the above, after the timing recovery circuit generates one or more first phase adjustment pulses and one or more second phase adjustment pulses, the difference value between the number of the one or more first phase adjustment pulses in the detection window and the number of the one or more second phase adjustment pulses in the detection window is obtained. It may be determined whether the timing recovery circuit reaches a locking state of timing recovery or not according to the difference value. As such, the identification efficiency of the locking state of timing recovery is effectively enhanced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2 is a flowchart of a timing lock identification method for timing recovery according to an embodiment of the disclosure.

FIG. 3 is a schematic diagram of detecting a first phase adjustment pulse and a second phase adjustment pulse according to an embodiment of the disclosure.

DESCRIPTION OF THE EMBODIMENTS

Figure 1:
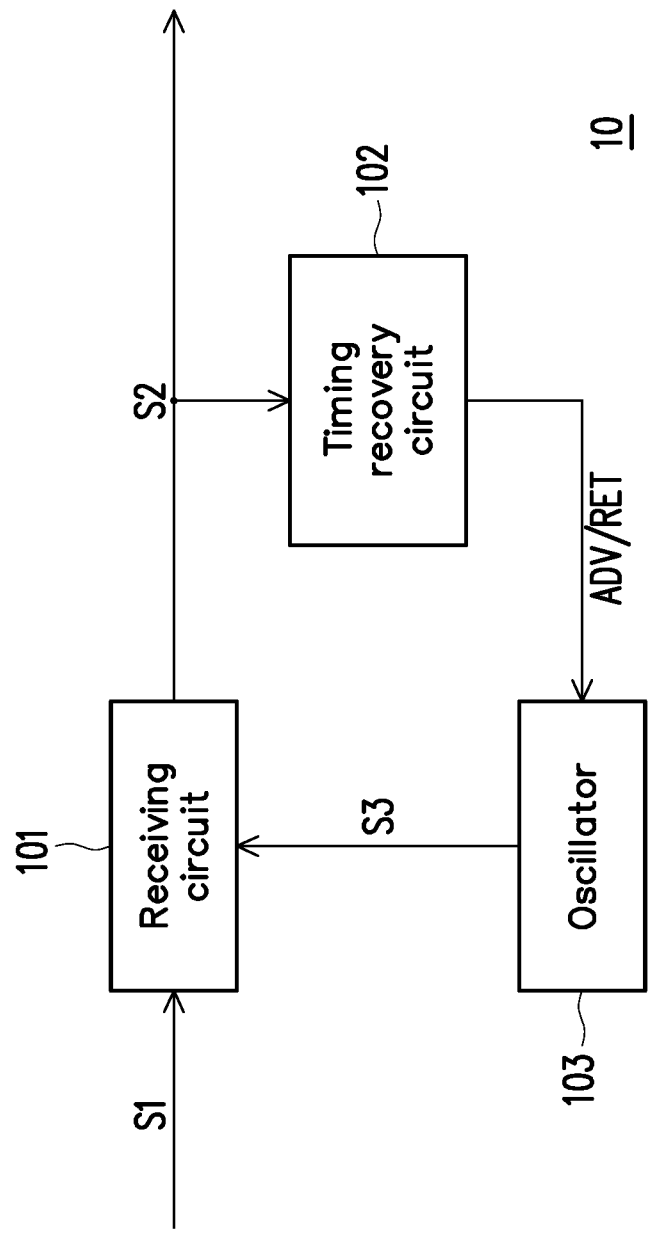
FIG. 1 is a schematic diagram of a signal receiving circuit according to an embodiment of the disclosure.

FIG. 1 is a schematic diagram of a signal receiving circuit according to an embodiment of the disclosure. FIG. 2 is a flowchart of a timing lock identification method for timing recovery according to an embodiment of the disclosure.

Referring to FIG. 1 and FIG. 2, a signal receiving circuit 10 receives a signal S1 (also referred to as an input signal) and performs operations related to signal receiving and adjustment, such as channel compensation, noise filtering and timing error elimination, on signal S1 so as to output a signal S2. The signal S1 may be, for example, an Ethernet signal, and the signal receiving circuit 10 may be set to a network connecting device such as a wired or wireless network interface card.

The signal receiving circuit 10 includes a receiving circuit 101, a timing recovery circuit 102 and an oscillator 103. The receiving circuit 101 is configured to receive the signal S1 and to perform operations such as channel compensation, noise filtering and sampling on the signal S1. For example, the receiving circuit 101 may include an analog-to-digital converter (ADC) and an equalizer (or an adaptive equalizer). The analog-to-digital converter is adapted to perform analog-to-digital conversion on the signal S1, and the equalizer is adapted to perform operations such as channel compensation and noise filtering on the converted signal S1 so as to output the signal S2. It should be noted that, the circuit composition of the receiving circuit 101 is not specifically limited in the disclosure as long as the receiving circuit 101 provides the aforementioned functions.

The timing recovery circuit 102 is connected to the receiving circuit 101 and the oscillator 103. The timing recovery circuit 102 is adapted to analyze the signal S2 and to perform a timing recovery operation. For example, the timing recovery circuit 102 may include a digital signal processor and at least one counter. In the timing recovery operation, the timing recovery circuit 102 may generate a pulse ADV (also referred to as one or more first phase adjustment pulses) and a pulse RET (also referred to as one or more second phase adjustment pulses) according to a performance condition of the timing recovery operation (step S201). The pulse ADV is adapted to increase a phase of the output signal of the oscillator 103 (i.e. a signal S3), while the pulse RET is adapted to decrease the phase of the signal S3.

In this embodiment, a voltage controlled oscillator (VCO) is taken as an example of the oscillator 103, but the disclosure does not limit the type of the oscillator 103. The oscillator 103 receives the pulse ADV and the pulse RET and outputs the signal S3. When the oscillator 103 receives the pulse ADV, the oscillator 103 increases the phase of the signal S3. When the oscillator 103 receives the pulse RET, the oscillator 103 decreases the phase of the signal S3. Or, viewing from another perspective, the signal S3 is a clock signal. The oscillator 103 decreases the delay amount of the signal S3 according to the pulse ADV and increases the delay amount of the signal S3 according to the pulse RET. The receiving circuit 101 performs sampling on the signal S1 according to the signal S3. With the pulse ADV and the pulse RET, the timing of the signal S3 may be gradually adjusted to synchronize with the timing of the signal S1, and the sampling accuracy of the signal S1 thereby increases.

During the process of performing the timing recovery operation, the timing recovery circuit 102 obtains a difference between the number of the pulse ADV and the number of the pulse RET in a detection window. For example, the timing recovery circuit 102 may count the number of the pulse ADV in the detection window and the number of the pulse RET by the counter, and then calculate the difference between the two numbers. The timing recovery circuit 102 may determine whether the locking state (also referred to as the locking state of timing recovery) is reached or not based on the difference value (step S202). It should be noted that, the timing recovery circuit 102 reaches the locking state means that the timing of the signal S3 has been adjusted to be synchronized (or nearly synchronized) with the timing of the signal S1. In an embodiment, when the timing (or the clock frequency) of the signal S3 is in a steady state (or a convergent state), it can also be regarded as the timing recovery circuit 102 reaching the locking state.

If it is determined that the timing recovery circuit 102 does not reach the locking state, the timing recovery circuit 102 may be in an acquisition stage. In the acquisition stage, the timing recovery circuit 102 may use a larger adjustment amplitude (or a larger step size) to adjust the clock frequency of the signal S3, so as to cause the timing of the signal S3 to be adjusted to synchronize with the timing of the signal S1 as soon as possible. However, if it is determined that the timing recovery circuit 102 reaches the locking state, the timing recovery circuit 102 enters a tracking stage. In the tracking stage, the timing recovery circuit 102 may adjust the clock frequency of the signal S3 with a smaller adjustment amplitude (also referred to as a second adjustment amplitude) to more accurately adjust the timing of the signal S3 to synchronize with the timing of the signal S1. Viewing from another perspective, if it is determined that the timing recovery circuit 102 does not reach the locking state, the timing recovery circuit 102 may adjust the clock frequency of the signal S3 with a certain adjustment amplitude (also referred to as a first adjustment amplitude). If it is determined that the timing recovery circuit 102 reaches the locking state, the timing recovery circuit 102 may adjust the clock frequency of the signal S3 with another adjustment amplitude (also referred to as a second adjustment amplitude), wherein the first adjustment amplitude is larger than the second adjustment amplitude.

In an embodiment, a detection window covers a time range (or a time interval). Within this time range (i.e. within this detection window), the timing recovery circuit 102 counts the number of the pulse ADV and the number of the pulse RET. When the difference between the number of the pulse ADV and the number of the pulse RET in the detection window is not greater than a threshold value, the timing recovery circuit 102 determines that the locking state of timing recovery is reached. However, when the difference between the number of the pulse ADV and the number of the pulse RET in the detection window is greater than the threshold value, the timing recovery circuit 102 determines that the locking state of timing recovery is not reached.

FIG. 3 is a schematic diagram of detecting a first phase adjustment pulse and a second phase adjustment pulse according to an embodiment of the disclosure. It should be noted that, FIG. 3 shows the number of the pulse ADV and the number of the pulse RET received at different time points.

Referring to FIG. 3, for convenience of explanation, the threshold value is set as 2 in this embodiment. Within the time range covered by a detection window 301 (i.e. the time range from a time point T31 to a time point T32), six pulses ADV and four pulses RET are generated. Therefore, in the detection window 301, the number of the pulses ADV as detected is 6, the number of the pulses RET as detected is 4, and the difference value between the numbers of the pulses ADV and the RET is 2. In this embodiment, since the difference value (i.e. 2) between the number of the pulse ADV and the number of the RET is not greater than the threshold value (i.e. 2), it can be determined that the locking state of timing recovery is reached.

In an embodiment, the timing recovery circuit 102 may also determine whether the pulses ADV of which the number is P are continuously detected in the set detection window or the pulses RET of which the number is Q are continuously detected in this set detection window. Herein, P and Q are both positive integers, and P and Q may be the same or different. It should be noted that, continuously detecting the pulses ADV of which the number is P means that no pulse RET is detected in the time range where the pulses ADV of which the number is P are continuously detected. Similarly, continuously detecting the pulses RET of which the number of Q means that no pulse ADV is detected in the time range where the pulse RET of which the number is Q are continuously detected.

If the pulses ADV of which the number is P are continuously detected in the set detection window or the pulses RET of which the number is Q are continuously detected in this detection window as set, the timing recovery circuit 102 determines that the locking state of timing recovery is not reached. Taking FIG. 3 as an example, if P is 4, when four pulses ADV are continuously detected in the detection window 301, it may be directly determined that the locking state of timing recovery is not reached. Alternatively, if Q is 2, when two pulses RET are continuously detected in the detection window 301, it may also be directly determined that the locking state of timing recovery is not reached.

In an embodiment, to determine whether the locking state of timing recovery is reached or not, both operations, namely according to the difference value between the number of the pulse ADV and the number of the RET and according to whether the pulse ADV or the pulse RET is continuously detected or not, may be adapted at the same time. For example, in an embodiment of FIG. 3, even if the difference value (i.e. 2) between the number of the pulse ADV and the number of the pulse RET in the detection window 301 is not greater than the threshold value (i.e. 2), since continuous pulses ADV of which the number is P (for example, 4) are detected in the detection window 301, it is directly determined that the locking state of timing recovery is not reached.

It should be noted that, the length of time that the detection window actually covers is not limited in the disclosure. For example, in an embodiment of FIG. 3, once the continuous pulse ADV of which the number is P or the continuous pulse RET of which the number is Q are detected in the detection window 301, the detection window 301 may be closed. Alternatively, in an embodiment, if a combination of the pulse ADV and the pulse RET appearing alternately in a set of R is detected, it is determined that the locking state of timing recovery is reached, and the detection window 301 may be closed. Herein, R may be any positive integer, depending on the actual needs. For example, if one pulse ADV, one pulse RET, one pulse ADV, and one pulse RET (i.e. two sets (R=2) of the pulse ADV and the pulse RET detected alternately) are detected in sequence within a certain time range, it is determined that the locking state of timing recovery is reached. In addition, in another embodiment, a plurality of detection windows with different time ranges may also be used together to increase the decision efficiency.

Figure 4:
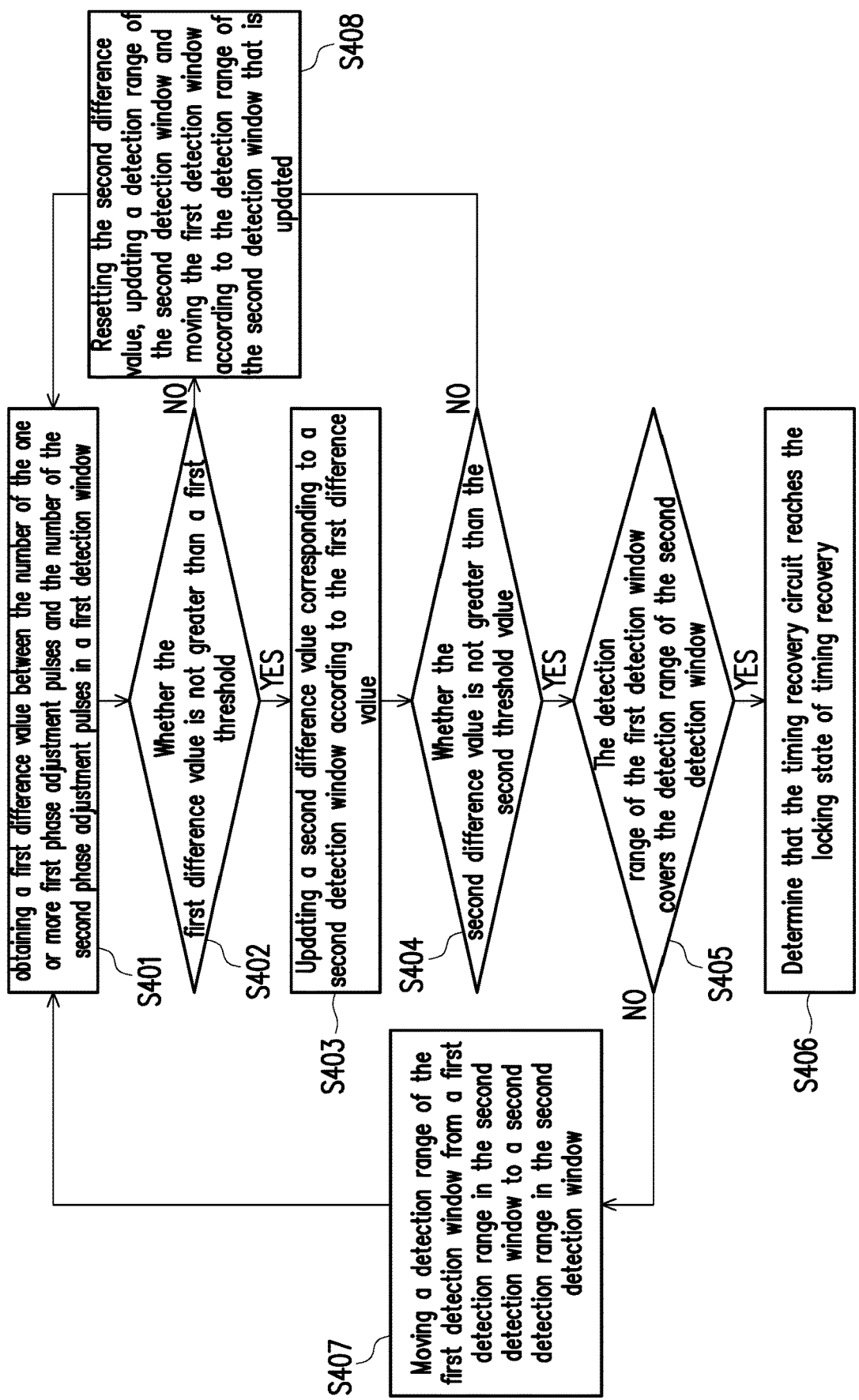
FIG. 4 is a flowchart of a timing lock identification method for timing recovery according to an embodiment of the disclosure.

FIG. 4 is a flowchart of a timing lock identification method for timing recovery according to an embodiment of the disclosure.

Referring to FIG. 4, In step S401, a detection window (also referred to as a first detection window) is set and the difference value (also referred to as the first difference value) between the number of the pulse ADV and the pulse RET in the first detection window is obtained. In step S402, it is determined whether the first difference value is not greater than a threshold value (also referred to as a first threshold value). When the first difference value is not greater than the first threshold value, in step S403, a difference value (also referred to as a second quantity difference) corresponding to another detection window (also referred to as a second detection window) is updated according to the first difference value, and the first detection window is contained in the second detection window. For example, the operation of updating the second difference value according to the first difference value may include adding the current second difference value to the currently obtained first difference value.

In step S404, it is determined whether the second difference value is not greater than the second threshold value. When the second difference value is not greater than the second threshold value, in step S405, it is determined whether the detection range of the first detection window covers the complete detection range of the second detection window or not. If the detection range of the first detection window covers the complete detection range of the second detection window, in step S406, it is determined that the timing recovery circuit reaches the locking state of timing recovery. However, in step S405, if the detection range of the first detection window does not cover the complete detection range of the second detection window, the process proceeds to step S407. In step S407, the detection range of the first detection window is moved from the current detection range (also referred to as the first detection range) in the second detection window to a next detection range (also referred to as the second detection range) in the second detection window, and then step S401 is repeated. Details of the implementation of FIG. 4 will be described below with reference to FIG. 5A to FIG. 5D and FIG. 6 as examples.

FIG. 5A to FIG. 5D are schematic diagrams of detecting a first phase adjustment pulse and a second phase adjustment pulse according to an embodiment of the disclosure.

Figure 5A:
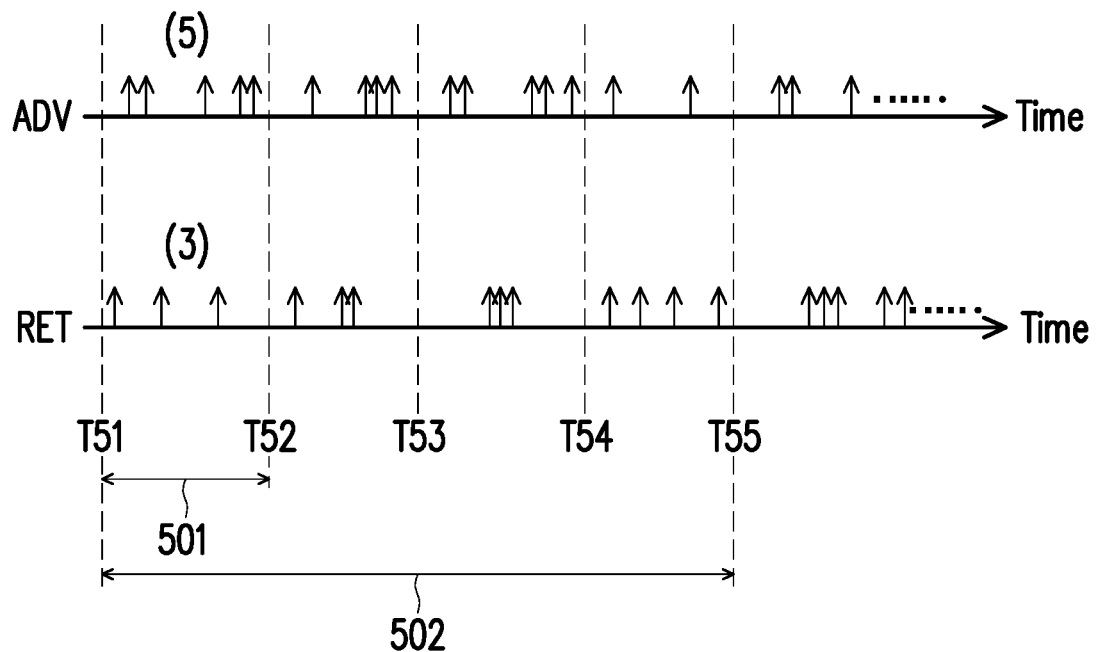
FIG. 5A to FIG. 5D are schematic diagrams of detecting a first phase adjustment pulse and a second phase adjustment pulse according to an embodiment of the disclosure.

Referring to both FIG. 4 and FIG. 5A, First, a detection window 501 (i.e. a first detection window) is set to include a time range between time points T51 and T52, and a detection window 502 (i.e. a second detection window) is set to include a time range between time points T51 and T55. In this embodiment, it is assumed that the first threshold value is 2, the second threshold value is 8, and an initial value of the second difference value is 0. However, in another embodiment, both the first threshold value and the second threshold value may be set as other values.

According to step S401 of FIG. 4, in the detection window 501, the number of the first phase adjustment pulse ADV is detected as 5, the number of the second phase adjustment pulse RET is 3, and the first difference value is 2 (5−3=2). Therefore, in step S402, it is determined that the first difference value (i.e. 2) is not greater than the first threshold value (i.e. 2). Next, in step S403, the second difference value (i.e. 0) is updated as 2 (i.e. 0+2=2) according to the first difference value (i.e. 2). Then, since it is determined in step S404 that the second difference value (i.e. 0) is not greater than the second threshold value (i.e. 8), and it is determined in step S405 that the time range of the detection window 501 does not cover the complete detection range of the detection window 502, in step S407, the detection window 501 is moved to a time range between the time point T52 and the time point T53, as shown in FIG. 5B.

Figure 5B:
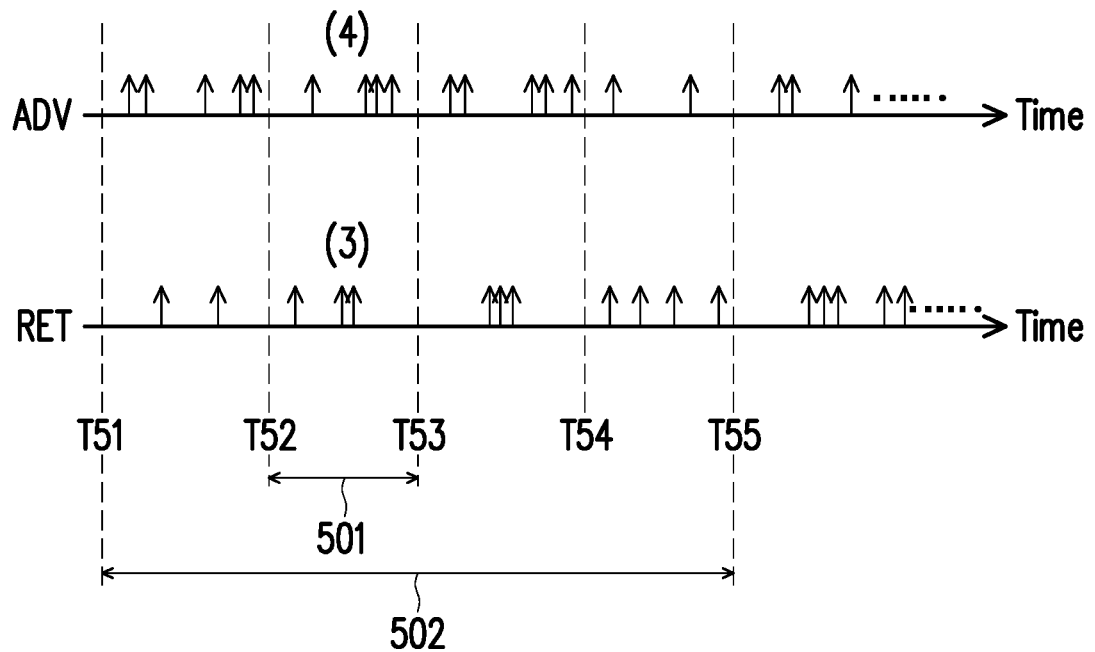

Referring to FIG. 5B, after the detection window 501 is moved to the time range between the time point T52 and the time point T53, step S401 may be repeated. According to step S401, in the detection window 501 having been moved, the number of the first phase adjustment pulse ADV is detected as 4, the number of the second phase adjustment pulse RET is 3, and the first difference value is 1 (4−3=1). Therefore, in step S402, it is determined that the first difference value (i.e. 1) is not greater than the first threshold value (i.e. 2). Next, in step S403, the second difference value (i.e. 2) is updated as 3 (2+1=3) according to the first difference value (i.e. 1). Then, since it is determined in step S404 that the second difference value (i.e. 3) is not greater than the second threshold value (i.e. 8), and it is determined in step S405 that the time range of the detection window 501 does not cover the complete detection range of the detection window 502, so in step S407, the detection window 501 is moved to a time range between the time point T53 and the time point T54, as shown in FIG. 5C.

Figure 5C:
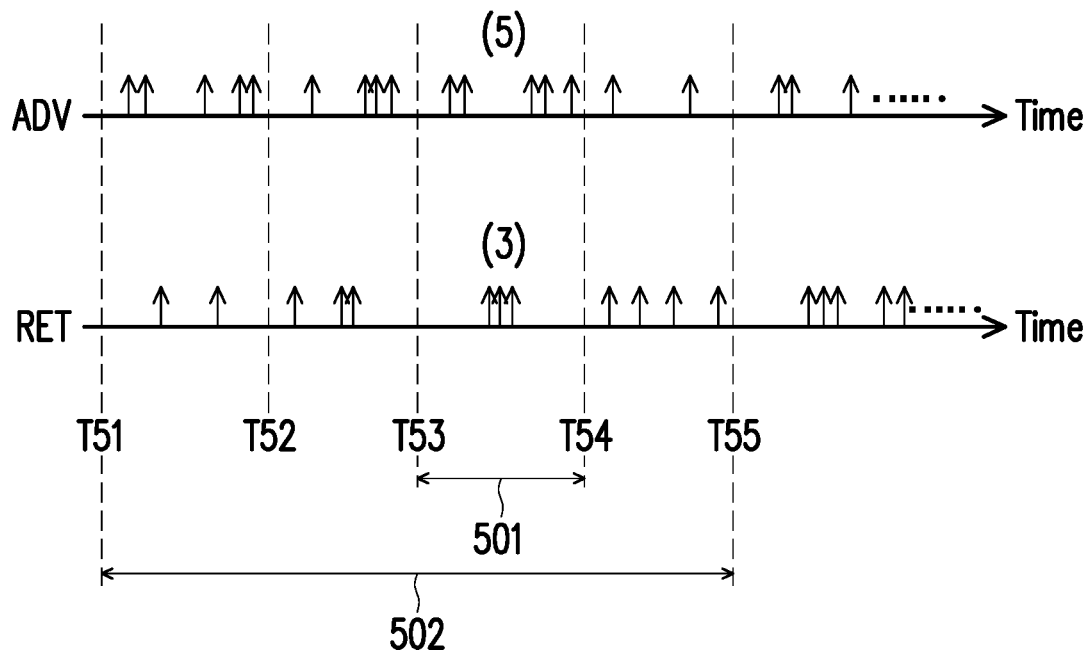

Referring to FIG. 5C, after the detection window 501 is moved to the time range between the time point T53 and the time point T54, step S401 may be repeated. According to step S401, in the detection window 501 having been moved, the number of the first phase adjustment pulse ADV is detected as 5, the number of the second phase adjustment pulse RET is 3, and the first difference value is 2 (5−3=2). Therefore, in step S402, it is determined that the first difference value (i.e. 2) is not greater than the first threshold value (i.e. 2). Next, in step S403, the second difference value (i.e. 3) is updated as 5 (3+2=5) according to the first difference value (i.e. 2). Then, since it is determined in step S404 that the second difference value (i.e. 5) is not greater than the second threshold value (i.e. 8), and it is determined in step S405 that the time range of the detection window 501 does not cover the complete detection range of the detection window 502, in step S407, the detection window 501 is moved to a time range between the time point T54 and the time point T55, as shown in FIG. 5D.

Figure 5D:
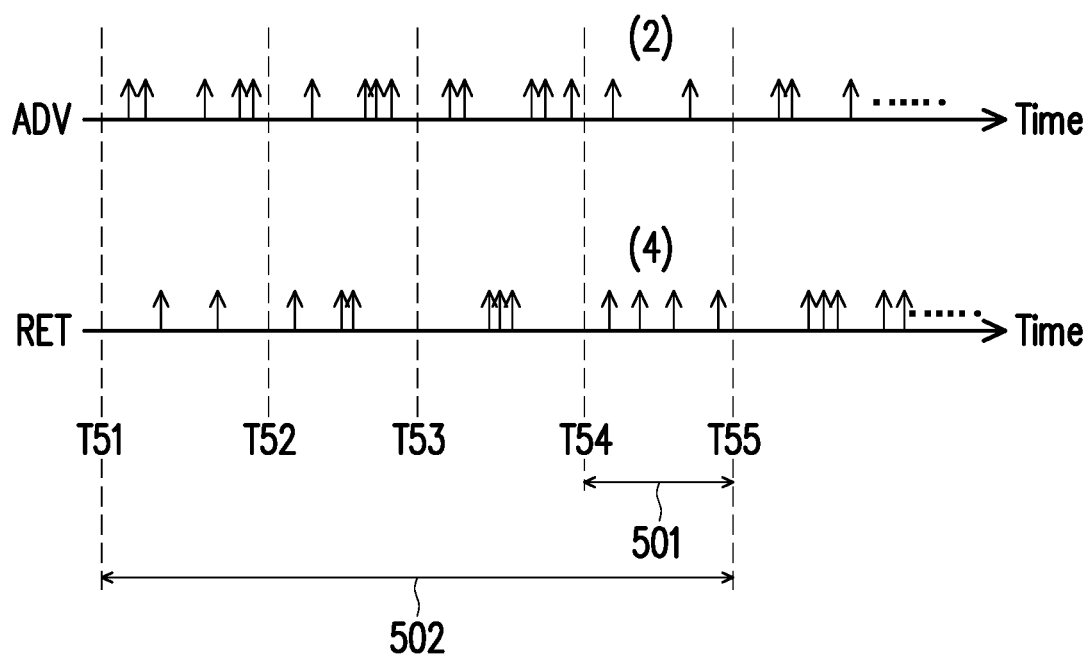

Referring to FIG. 5D, after the detection window 501 is moved to the time range between the time point T54 and the time point T55, step S401 may be repeated. According to step S401, in the detection window 501 having been moved, the number of the first phase adjustment pulse ADV is detected as 2, the number of the second phase adjustment pulse RET is 4, and the first difference value is 2 (4−2=2). Therefore, in step S402, it is determined that the first difference value (i.e. 2) is not greater than the first threshold value (i.e. 2). Next, in step S403, the second difference value (i.e. 5) is updated as 7 (5+2=7) according to the first difference value (i.e. 2). At this moment, since it is determined in step S404 that the second difference value (i.e. 7) is not greater than the second threshold value (i.e. 8), and it is determined in step S405 that the time range of the detection window 501 covers the complete detection range of the detection window 502, therefore it is determined in step S406 that the timing recovery circuit reaches the locking state of timing recovery.

Referring to FIG. 4 again, if it is determined in step S402 that the first difference value is greater than the first threshold value or it is determined in step S404 that the second difference value is greater than the second threshold value, the process proceeds to step S408. In step S408, the second difference value is reset (for example, reset to the initial value), the detection range of the second detection window is updated, and the first detection window is moved to the updated second detection window. Then, the process continues to step S401.

Figure 6:
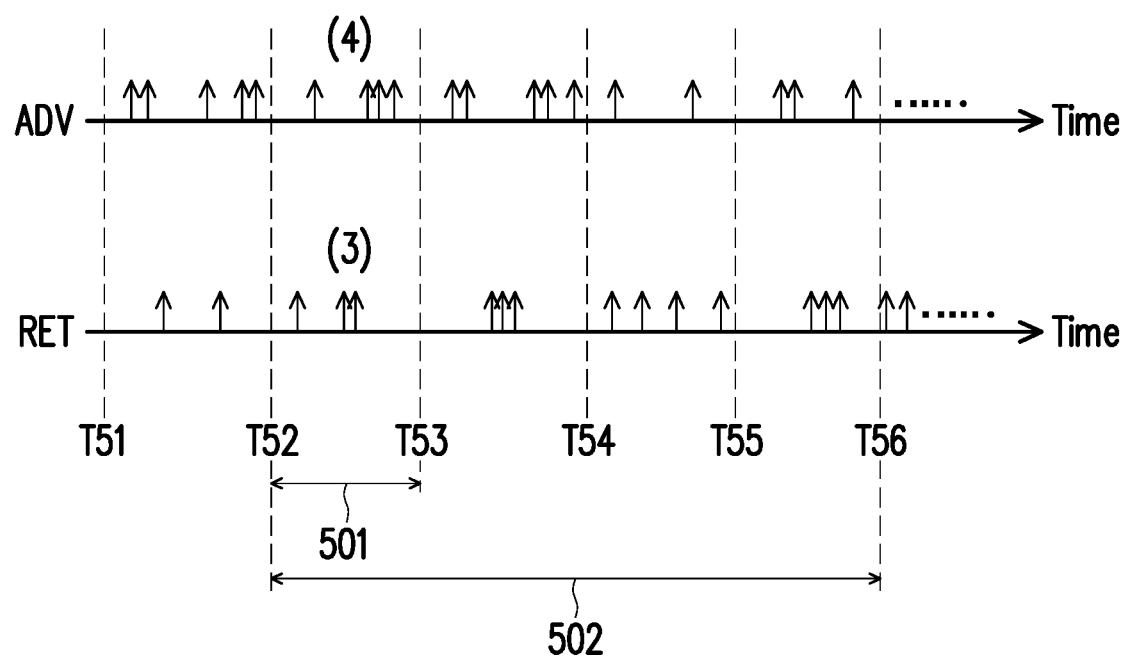
FIG. 6 is a schematic diagram of detecting a first phase adjustment pulse and a second phase adjustment pulse according to an embodiment of the disclosure.

FIG. 6 is a schematic diagram of detecting a first phase adjustment pulse and a second phase adjustment pulse according to an embodiment of the disclosure.

Referring to both FIG. 4 and FIG. 6, wherein FIG. 6 may be continued from any of the embodiments of FIGS. 5A to 5D. If it is determined in step S402 that the first difference value is greater than the first threshold value and/or it is determined in step S404 that the second difference value is greater than the second threshold value, the second difference value is reset to the initial value (i.e. 0). The detection window 502 may be updated to a time range covering from the time point T52 to a time point T56. The detection window 501 may be moved to a time range covering from the time point T52 to a time point T53. Then, according to the flowchart of FIG. 4, the detection window 501 is sequentially moved within the time range covered by the detection window 502 and the related counting operation is performed so as to determine whether the timing recovery circuit reaches the locking state of timing recovery. For details of related operations, reference may be made to the embodiment of FIG. 5A to FIG. 5D, which are not repeated hereinafter.

It should be noted that, in the embodiments of FIG. 5A to FIG. 5D and FIG. 6, the lengths of time between the time points T51 and T52, between the time points T52 and T53, between the time points T53 and T54, and between the time points T54 and T55 are all the same, and the length of time between the time points T51 and T55 is four times the length of time between the time points T51 and T52. However, in another embodiment, the length of time between the time points T51 and T55 may also be two times or three times etc. of the length of time between the time points T51 and T52, and the length of time of any two adjacent time ranges may be different (for example, the length of time between the time points T51 and T52 may be different from the length of time between the time points T52 and T53).

It should be noted that, in any of the embodiments of FIG. 5A to FIG. 5D, it may also be determined whether the pulses ADV of which the number is P are continuously detected in the detection window 501 or the pulses RET of which the number is Q are continuously detected in the detection window 501. If the pulses ADV of which the number is P or the pulses RET of which the number is Q are continuously detected in the detection window 501, it may be directly determined that the locking state of timing recovery is not reached. Alternatively, in any of the embodiments of FIG. 5A to FIG. 5D, if the pulses ADV of which the number is P or the pulses RET of which the number is Q are continuously detected in the detection window 501, the process proceeds to step S408 of FIG. 4, as shown in the embodiment of FIG. 6. Moreover, each step of FIG. 2 and FIG. 4 may be performed by the timing recovery circuit 102 of FIG. 1.

In sum of the above, in the process of performing a timing recovery operation on an input signal, it may be determined whether or not the timing recovery circuit reaches the locking state of timing recovery based on a difference value between the number of the one or more first phase adjustment pulses and the number of the one or more second phase adjustment pulses generated by the timing recovery circuit, by which the identification efficiency of the locking state of timing recovery is effectively enhanced.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:
1. A timing lock identification method for timing recovery, comprising:
   generating one or more first phase adjustment pulses and one or more second phase adjustment pulses by a timing recovery circuit according to an input signal, wherein the one or more first phase adjustment pulses are configured to increase a phase of an output signal of an oscillator, and the one or more second phase adjustment pulses are configured to decrease the phase of the output signal; and obtaining a difference value between the number of the first phase adjustment pulses and the number of the second phase adjustment pulses in a detection window and determining whether the timing recovery circuit reaches a locking state of timing recovery or not according to the difference value, wherein determining whether the timing recovery circuit reaches the locking state of timing recovery according to the difference value comprises:

when the difference value is not greater than a threshold value, determining that the timing recovery circuit reaches the locking state of timing recovery; and when the difference value is greater than the threshold value, determining that the timing recovery circuit does not reach the locking state of timing recovery.

2. The timing lock identification method according to claim 1, wherein determining whether the timing recovery circuit reaches the locking state of timing recovery according to the difference value further comprises:

if the one or more first phase adjustment pulses of which the number is P are continuously detected in the detection window or the one or more second phase adjustment pulses of which the number is Q are continuously detected in the detection window, determining that the timing recovery circuit does not reach the locking state of timing recovery, wherein P and Q are integers greater than 1.

3. The timing lock identification method according to claim 1, wherein determining whether the timing recovery circuit reaches the locking state of timing recovery according to the difference value further comprises:

obtaining a first difference value between the number of the one or more first phase adjustment pulses and the number of the one or more second phase adjustment pulses in a first detection window;

if the first difference value is not greater than a first threshold value, a second difference value corresponding to a second detection window is updated according to the first difference value, wherein the first detection window is contained in the second detection window; and determining whether the timing recovery circuit reaches the locking state of timing recovery according to the second difference value.

4. The timing lock identification method according to claim 3, wherein determining whether the timing recovery circuit reaches the locking state of timing recovery according to the difference value further comprises:

if the first difference value is greater than the first threshold value or if the second difference value is greater than the second threshold value, resetting the second difference value, and updating a detection range of the second detection window; and moving the first detection window according to the detection range of the second detection window that is updated.

5. The timing lock identification method according to claim 3, wherein determining whether the timing recovery circuit reaches the locking state of timing recovery according to the difference value further comprises:

if the first difference value is not greater than the first threshold value, moving a detection range of the first detection window from a first detection range in the second detection window to a second detection range in the second detection window.

6. The timing lock identification method according to claim 3, wherein determining whether the timing recovery circuit reaches the locking state of timing recovery according to the second difference value comprises:

if the detection range of the first detection window completely covers the detection range of the second detection window and the second difference value is not greater than the second threshold value, determining that the timing recovery circuit reaches the locking state of timing recovery.

7. The timing lock identification method according to claim 3, wherein determining whether the timing recovery circuit reaches the locking state of timing recovery according to the difference value further comprises:

if the one or more first phase adjustment pulses of which the number is P are continuously detected in the first detection window or the one or more second phase adjustment pulses of which the number is Q are continuously detected in the first detection window, resetting the second difference value, and updating a detection range of the second detection window, wherein P and Q are integers greater than 1; and moving the first detection window according to the detection range of the second detection window that is updated.

8. A signal receiving circuit, comprising:
a receiving circuit receiving an input signal;
a timing recovery circuit connected to the receiving circuit and generating one or more first phase adjustment pulses and one or more second phase adjustment pulses according to the input signal; and
an oscillator, connected to the receiving circuit and the timing recovery circuit, generating an output signal, and increasing a phase of the output signal according to the one or more first phase adjustment pulses or decreasing the phase of the output signal according to the one or more second phase adjustment pulses,
wherein the timing recovery circuit determines whether a locking state of timing recovery is reached or not based on a difference value between the number of the one or more first phase adjustment pulses in a detection window and the number of the second phase adjustment pulses in the detection window, wherein
if the difference value is not greater than a threshold value, the timing recovery circuit determines that the locking state of timing recovery is reached; and
if the difference value is greater than the threshold value, the timing recovery circuit determines that the locking state of timing recovery is not reached.

9. The signal receiving circuit according to claim 8, wherein the operation of the timing recovery circuit determining whether the locking state of timing recovery is reached or not based on the difference value between the number of the one or more first phase adjustment pulses in the detection window and the number of the one or more second phase adjustment pulses in the detection window further comprises:

if the one or more first phase adjustment pulses of which the number is P are continuously detected in the detection window or the one or more second phase adjustment pulses of which the number is Q are continuously detected in the detection window, determining that the locking state of timing recovery is not reached, wherein P and Q are integers greater than 1.

10. The signal receiving circuit according to claim 8, wherein the operation of the timing recovery circuit determining whether the locking state of timing recovery is reached or not based on the difference value between the number of the one or more first phase adjustment pulses in the detection window and the number of the one or more second phase adjustment pulses in the detection window further comprises:
  obtaining a first difference value between the number of the one or more first phase adjustment pulses and the number of the one or more second phase adjustment pulses in a first detection window;
  if the first difference value is not greater than a first threshold value, a second difference value corresponding to a second detection window is updated according to the first difference value, wherein the first detection window is contained in the second detection window; and
  determining whether the locking state of timing recovery is reached according to the second difference value.

11. The signal receiving circuit according to claim 10, wherein the operation of the timing recovery circuit determining whether the locking state of timing recovery is reached or not based on the difference value between the number of the one or more first phase adjustment pulses in the detection window and the number of the one or more second phase adjustment pulses in the detection window further comprises:
  if the first difference value is greater than the first threshold value or if the second difference value is greater than the second threshold value, resetting the second difference value, and updating a detection range of the second detection window; and
  moving the first detection window according to the detection range of the second detection window that is updated.

12. The signal receiving circuit according to claim 10, wherein the operation of the timing recovery circuit determining whether the timing recovery circuit reaches the locking state of timing recovery or not based on the difference value between the number of the one or more first phase adjustment pulses in the detection window and the number of the one or more second phase adjustment pulses in the detection window further comprises:
  if the first difference value is not greater than the first threshold value, moving a detection range of the first detection window from a first detection range in the second detection window to a second detection range in the second detection window.

13. The signal receiving circuit according to claim 10, wherein the operation of the timing recovery circuit determining whether the timing recovery circuit reaches the locking state of timing recovery or not according to the second difference value comprises:
  if the detection range of the first detection window completely covers the detection range of the second detection window and the second difference value is not greater than the second threshold value, determining that the locking state of timing recovery is reached.

14. The signal receiving circuit according to claim 10, wherein the operation of the timing recovery circuit determining whether the locking state of timing recovery is reached or not based on the difference value between the number of the one or more first phase adjustment pulses in the detection window and the number of the one or more second phase adjustment pulses in the detection window further comprises:
  if the one or more first phase adjustment pulse of which the number is P are continuously detected in the first detection window or the one or more second phase adjustment pulses of which the number is Q are continuously detected in the first detection window, resetting the second difference value, and updating a detection range of the second detection window, wherein P and Q are integers greater than 1; and
  moving the first detection window according to the detection range of the second detection window that is updated.

* * * * *